United States Patent [19]

Anderson

[11] Patent Number: 4,598,388
[45] Date of Patent: Jul. 1, 1986

[54] SEMICONDUCTOR MEMORY WITH REDUNDANT COLUMN CIRCUITRY

[75] Inventor: Daniel F. Anderson, Richmond, Tex.

[73] Assignee: Texas Instruments Incorporated, Dallas, Tex.

[21] Appl. No.: 693,417

[22] Filed: Jan. 22, 1985

[51] Int. Cl.$^4$ .................. G11C 7/00; G06F 11/00
[52] U.S. Cl. ................................ 365/200; 371/11
[58] Field of Search ............... 365/200, 210, 240; 371/10, 11

[56] References Cited

U.S. PATENT DOCUMENTS 3,803,560  4/1974  DeVoy et al. .................. 371/11
4,051,354  9/1977  Choate .......................... 365/200

FOREIGN PATENT DOCUMENTS

WO83/02847  8/1983  PCT Int'l Appl. ............ 365/200

Primary Examiner—Terrell W. Fears
Assistant Examiner—Guy M. Miller
Attorney, Agent, or Firm—John G. Graham

[57] ABSTRACT

A redundant column circuit includes a row shared predecoder (12) and predecoders (16), (18) and (20). The predecoders (16-20) are input to a one-of-sixty-four decoder (28) for providing sixty-four decoded outputs therefrom, each of which is input to a one-of-four multiplexer (30). Each of the multiplexers (30) selects one of four normal decode outputs and one of four redundant decode outputs. The selected decode output is determined by the four outputs from the row shared predecoder (12). A switch bank (32) of single pole double throw switches selects between a normal and a redundant output with the redundant output having the address associated therewith incremented by one. The output of the switches in the bank (32) is input to the deactivation circuits (36) for output therefrom to a memory array (38). The memory array (38) has a redundant column (R) in parallel therewith which is controlled by the first switch in the switch bank (32). When a defective column is replaced, all of the switches between the redundant column and the defective column have the state thereof changed and the redundant column is activated. The address for each of the columns having a lower position than the defective column is incremented by one. The output of each of the columns is input to individual shift bits of a serial shift register (42), each shift bit having a normally open switch (44) associated therewith. Closure of the switches (44) bypasses the bit. A redundant shift bit R in the serial shift register (42) has a normally closed switch (45) associated therewith to bypass it in the normal mode. When a defective column is replaced, the associated shift bit has the switch (44) closed to bypass that shift bit and the switch (45) open.

17 Claims, 10 Drawing Figures

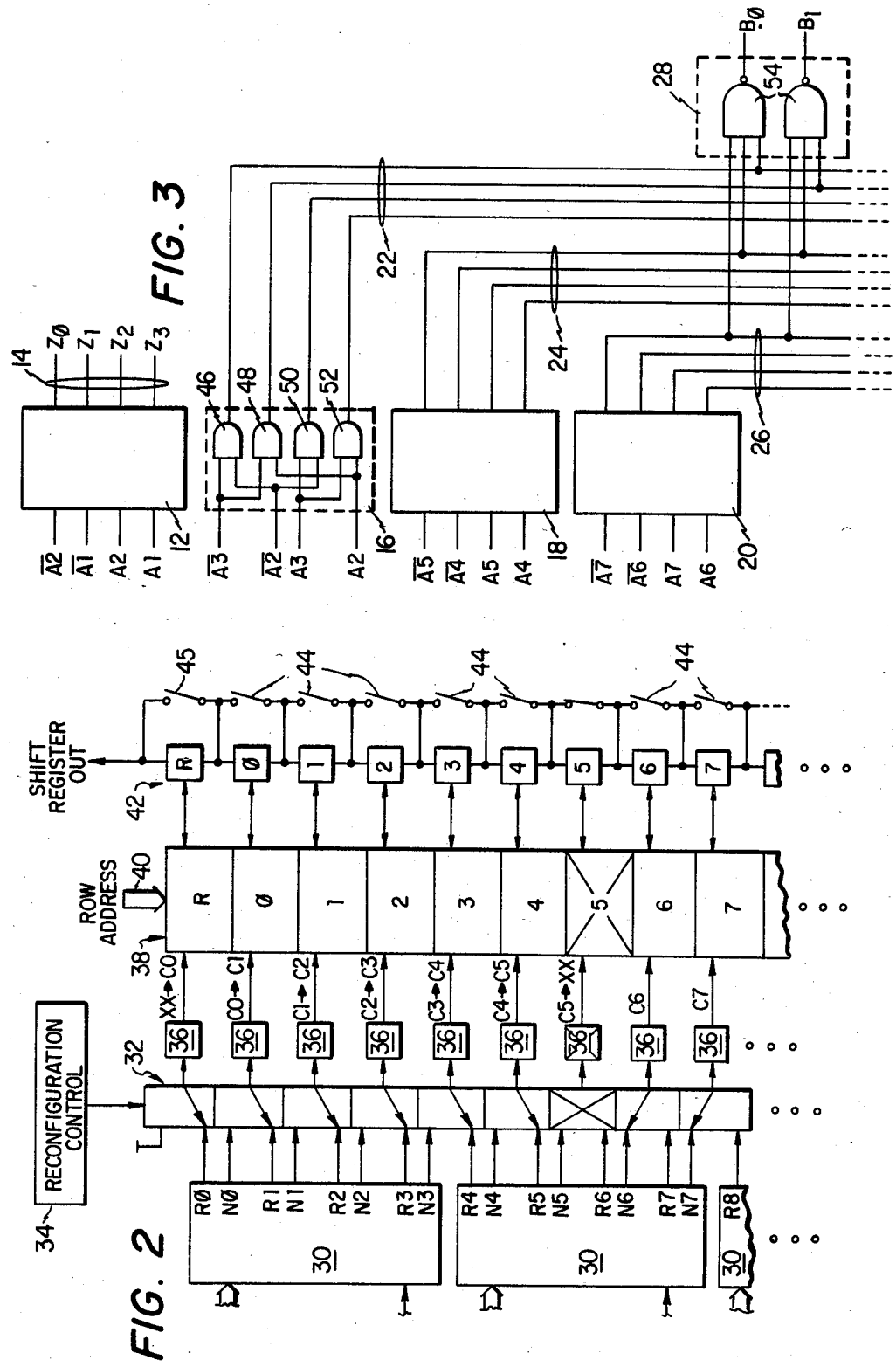

SEMICONDUCTOR MEMORY WITH REDUNDANT COLUMN CIRCUITRY

TECHNICAL FIELD OF THE INVENTION

The present invention pertains in general to semiconductor memories and, more particularly, to a semiconductor memory with a redundant column and an on-chip shift register for use in video applications.

BACKGROUND OF THE INVENTION

In fabrication of semiconductor memories, one technique utilized to increase production yield is to provide redundant circuits on the chip to allow for replacement of key circuits which prove defective. During testing of the chip, the defective portion of the circuit is identified and the redundant circuit, if one exists, is activated by opening an associated fuse or similar mechanism. The disadvantage to this technique is that only certain circuits on the chip can be given redundancy, which is sometimes impractical from a cost versus yield standpoint.

Redundancy is especially suited for repetitive circuits having a large number of repeating elements arranged in some form of an array, such that one redundant circuit can replace a single defect in any of a large number of circuit elements. One such device is a semiconductor memory comprised primarily of memory elements. These memory elements are arranged in rows and columns wherein the redundant element would be either a row of memory elements or a column of memory elements. If, for example, one element in a given column was determined to be defective, this would classify the device as defective. This defective column could then be replaced by a redundant column and the device would be fully operational. A typical memory would have, for example, 256 rows and 256 columns. One redundant column would therefore be able to replace one of the 256 columns, thus constituting an efficient use of a redundant circuit.

One problem encountered in replacing a column or row in a semiconductor memory is maintaining address integrity; that is, the redundant column must have the same address as the defective column. This is normally implemented by providing a universal decode circuit in association with the redundant column circuitry. Appropriate fuses are included that can be opened to both activate the redundant column circuitry and also program the universal decode circuitry for the appropriate address. One disadvantage to this type of circuitry is that the actual physical sequence of columns with the redundant circuitry activated is different than that with the redundant circuitry being inactive. For example, if the redundant column were placed parallel to the memory array and the 64th column were determined to be defective, this column would be inactivated and the redundant column activated and programmed for an address corresponding to the 64th column. However, the redundant 64th column would now be physically outside of the array rather than between the 63rd and 65th columns. In some applications, this would require additional circuitry to maintain the sequential nature of the memory output.

One application which requires the outputs of the memory array to be in a predetermined sequence is a video Random Access Memory (RAM). In the video RAM, the memory elements are arranged such that they are directly mapped to the pixel location on a display. Addressing of a single row of memory elements in the video RAM outputs data corresponding to a group of adjacent pixels. This data is output in parallel and loaded into a serial shift register having a length equal to the number of columns in the array. This data is then serially output from the shift register to place a sequence of adjacent pixels on the display for a given scan line. The length of the shift register and the corresponding number of columns in the array may be sufficient to supply all of the pixels in a given line or, alternatively, the number of rows of memory may be required to define a given scan line.

By utilizing the serial shift register, the rate at which the pixel elements are displayed on the screen can be much higher than the rate at which the memory is addressed. For example, for a memory array with 256 columns, data will be loaded into a 256 element shift register. Once addressed and loaded into the shift register, the data is then serially output to the display. New data is then loaded in the shift register. Since it requires 256 clock cycles to shift out all of the data in the serial shift register prior to reloading, the rate of the shift register clock as compared to the addressing sequence can be up to 256 times greater.

In replacing a defective column in a video RAM, it is necessary that the output of the redundant column have the same address as the defective column and also have the output loaded into the shift register at the same physical location as that of the output for the defective column. By utilizing conventional redundant circuitry techniques and merely changing the address for the redundant column, this would require additional circuitry to feed the output of the redundant column to the appropriate one of the shift register inputs. Since the redundant column must be universal, it would be necessary to provide circuitry that would allow for interface of the output with each of the shift register inputs. This would require a large amount of circuitry which would present a significant disadvantage.

In view of the above disadvantages, there exists a need for redundant column circuitry for a video RAM to both replace a defective column and to insert the output of the redundant column into the physical sequence of outputs from the memory array such that the integrity of the physical sequence is maintained.

SUMMARY OF THE INVENTION

The present invention disclosed and claimed herein comprises a defect tolerant memory which includes an array of memory elements arranged in rows and columns, each column of elements selected by a column address signal and each row of elements selected by a row address signal. A redundant column of memory elements is disposed adjacent the array and is selectable by a predetermined column address with the redundant column memory normally inactive. When a column of memory elements in the array is determined to be defective, this column is deactivated and a circuit is provided for activating the redundant column, such that it can be addressed by the predetermined column address. The addresses of the columns that are physically disposed between the defective column and the redundant column are reconfigured and incremented by one towards the defective column address.

In yet another embodiment of the present invention, a plurality of shift bits are disposed adjacent the array, each of the shift bits associated with the output of each of the columns in the array. The primary shift bits are connected together to form a serial shift register. A redundant shift bit is disposed adjacent the output of the redundant column to receive the output therefrom. The primary shift bits have normally open switches disposed thereacross to provide a bypass path when closed. The redundant shift bit is disposed in series with the primary shift bits and has a normally closed switch disposed thereacross which, when opened, functionally places the redundant shift bit in series with the primary shift bits. When a defective column is replaced, the primary shift bit associated with the defective column is bypassed and the redundant shift bit placed into functional operation.

BRIEF DESCRIPTION OF THE DRAWINGS

For a more complete understanding of the present invention and the advantages thereof, reference is now made to the following description taken in conjunction with the accompanying Drawings in which:

FIG. 2 illustrates a schematic block diagram of the memory array with one defective element replaced by the redundant column;

FIG. 3 illustrates a schematic block diagram of the predecode circuitry;

DETAILED DESCRIPTION OF THE INVENTION

Figure 1:
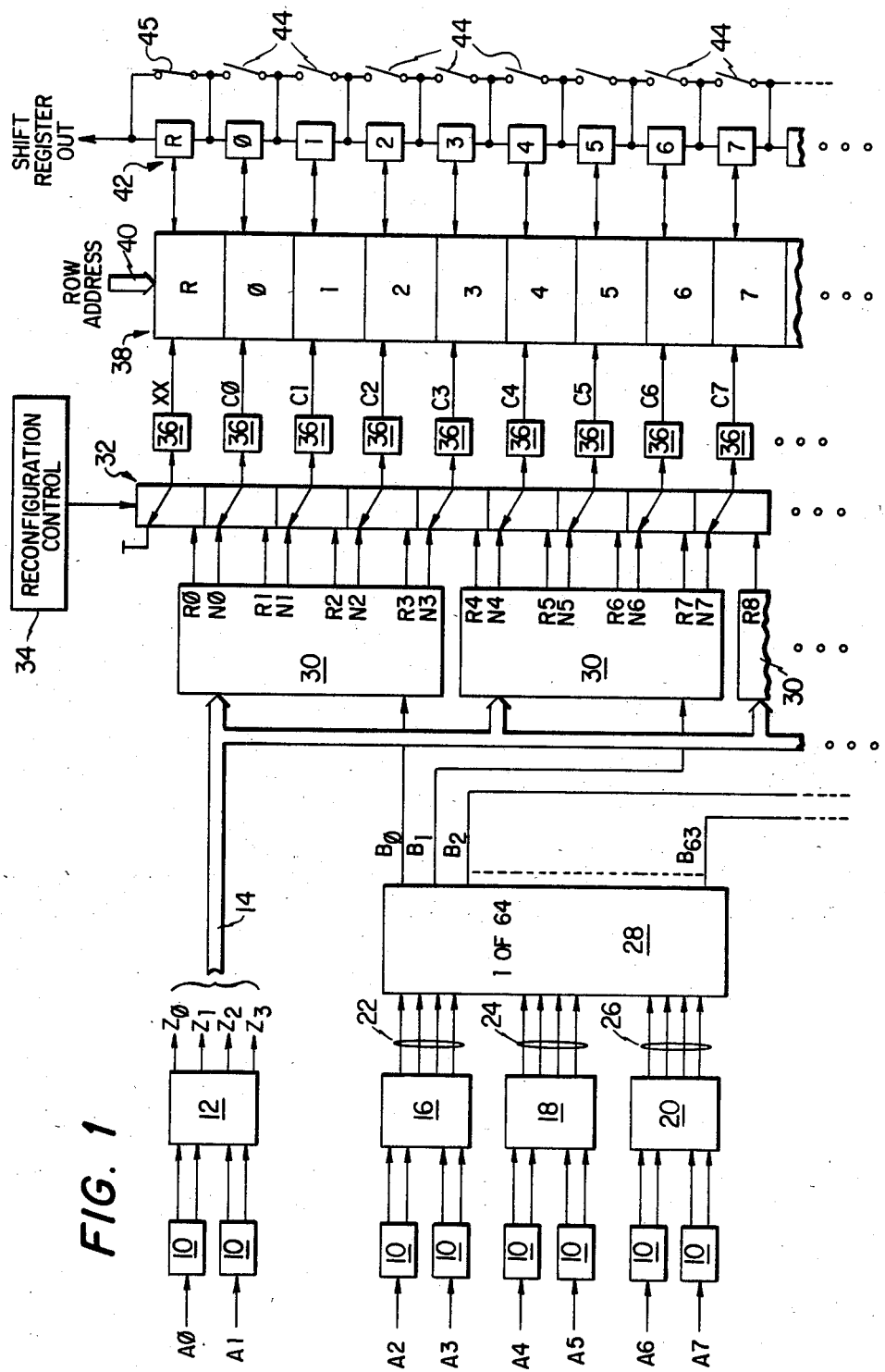
FIG. 1 illustrates a schematic block diagram of a memory array with a redundant column in accordance with the present invention.

Referring now to FIG. 1, there is illustrated a schematic block diagram of a memory array utilizing redundant circuitry in accordance with the present invention. The memory is comprised of an array of memory elements that may be arranged in any configuration, with the preferred embodiment having the elements arranged in a 1×256×256 array for video applications. Therefore, the memory array has 256 rows and 256 columns with each element of the array individually addressable for output therefrom. The operation of this memory array is fully described in U.S. Pat. No. 4,330,852, U.S. Pat. No. 4,322,635, and U.S. Pat. No. 4,347,587, all assigned to Texas Instruments Incorporated.

An eight bit address word is provided for both addressing rows and columns with only the decode scheme for the columns illustrated. The address word is input to the column decoder and one of 256 columns activated in response to receiving the address. Each of the address bits AO-A7 is input to individual buffer circuits 10 to output the inverted and noninverted forms of the input data bit. For example, the output from the buffer 10 connected to the AO data bit is AO and $\overline{AO}$. The buffers 10 can utilize a noninverting buffer and an inverting buffer, one example of which is disclosed in U.S. Pat. No. 4,314,362, issued to Klaas, et al. and assigned to Texas Instruments Incorporated.

The outputs of the buffers 10 are connected to the A0–A1 address to generate A0, $\overline{A0}$, A1 and $\overline{A1}$, which are also input to a row shared predecoder 12 to output four row shared predecode bits $Z_0$, $Z_1$, $Z_2$ and $Z_3$. These bits are output onto a row shared predecode bus 14.

The outputs of the buffers 10 that are connected to the A2 and A3 address bits are input to a predecoder 16, the outputs of the buffers 10 that are connected to the A4 and A5 address bits are connected to a predecoder 18 and the buffers 10 that are connected to the A6 and A7 address bits are input to a predecoder 20. The predecoder 16 provides four predecode lines 22, the predecoder 18 provides four predecode lines 24 and the predecoder 20 provides four predecode lines 26, all of which are input to a one-of-sixty-four decoder 28. The one-of-sixty-four decoder 28 provides sixty four decoded outputs $B_0$–$B_{63}$.

Each of the outputs $B_0$–$B_{63}$ of the one-of-sixty-four decoder 28 is connected to the input of an associated one-of-four multiplexer 30. The multiplex inputs of each of the multiplexers 30 are connected to the row shared predecode bus 14 with each of the signals $Z_0$–$Z_3$ determining which of the four multiplexer outputs are activated. Each of the multiplexers 30 has a redundancy capability; that is, each of the outputs has a corresponding redundant output which is activated only when redundancy is required. The normal outputs are labeled N(K) and the redundant outputs are labeled R(K), wherein K is equal to the values between 0 and 256. For example, the first four outputs of the multiplexer 30 associated with the $B_0$ output of the one-of-sixty-four decoder 28 are labeled N0–N3 with the redundant outputs labeled R0–R3. In a similar manner, the multiplexer 30 associated with the $B_1$ output of the one-of-sixty-four decoder 28 has the normal outputs labeled N4–N7 and the redundant outputs labeled R4–R7. Therefore, activation of the appropriate one of the outputs of the one-of-sixty-four decoder 28 results in activation of two of the outputs of the corresponding one of the multiplexers 30, the redundant and the normal decode output, as determined by the state of the row shared predecode bits $Z_0$–$Z_3$.

The outputs of the one-of-four multiplexer 30 are connected to inputs of a bank of Single Pole Double Throw (SPDT) switches 32. The switch bank 32 is comprised of a plurality of individual SPDT switches having two switched inputs and one common output. The two inputs are connected to both a normal decode output and an adjacent redundant decode output N(K) and R(K+1). By determining the state of the switch, the decode output from the switch can be altered by incrementing the address by one. For example, if the decode output is for a column address of "3" in the normal switch position, the switch in the switched position changes the decode output to a column address of "4". Therefore, an address of "4" would be required to activate this output. The only switch in the switch bank 32 that is not connected to both a redundant decode output and a normal decode output is the switch associated with the R0 redundant output. This switch has the other input thereof connected to an external reference, as will be described hereinbelow.

Each of the outputs of the switches in the switch bank 32 is connected to the input of a deactivation circuit 36, each of which has the output thereof connected to an associated column in a memory array 38. The memory array 38 is comprised of 256 normal columns of memory elements labeled "0" through "255" referring to the relative position. The memory array also has a redundant column labeled "R" which is disposed adjacent the column in position "0". Each of the columns is activated by a decode signal which corresponds to column address. Hereinafter, the address associated with a column will be referred to as the "column decode address". The column decode address input for the redundant column R is labeled "XX" and the column decode address inputs for the normal columns in the array 38 are labeled "C0–C255" in the normal mode, with the switch banks 32 relecting the N0–N255 decode outputs. The column decode address inputs C0–C255 each correspond to a specific value of the column address A0–A7 from "0" to "255", respectively. The R0 output of the multiplexer 30 and the first switch in the switch bank 32 are associated only with the redundant column "R" of the array 38. In a similar manner, the N0 and R1 outputs of the multiplexer 30 and the corresponding switch are associated with the "0" column of the memory array 38. The address in the memory array 38 is addressed from a row address signal through row address lines 40.

The output of each of the columns in the memory array 38 is interfaced with the load inputs of a serial shift register 42 which is comprised of 256 shift bits labeled "0" through "255" corresponding to relative position and a shift bit labeled "R". The redundant column output is connected to the shift bit "R" and the remaining columns "0" through "255" output to shift bits "0" through "255", respectively.

Each of the shift bits "0" through "255" has a bypass switch 44 associated therewith to selectively bypass the input to the output such that during shifting of data therethrough, data is bypassed around the respective shift bit to effectively delete the shift bit from the shifting sequence. The switches 44 are in the normally open position. A bypass switch 45 is associated with the "R" shift bit and is in the normally closed position. This normal position refers to the mode in which the redundant column is not activated, hereinafter referred to as the "reconfigured mode". Each of the switches 44 is fuse controlled such that a single one of the shift bits "0" through "255" can be bypassed and the redundant shift register "R" inserted in its place, as will be described hereinbelow. The shift bits "0" through "255" and "R" are physically disposed adjacent the respective columns of the array 38.

In normal operation, each of the shift bits is directly connected to the outputs of the columns in the array 38 through a transfer gate (not shown). The only signals necessary to load the shift bits of the shift register 45 are a row address signal and a transfer gate signal. The transfer gate is comprised of 256 series switches for connecting the outputs of all of the columns to the inputs of the respective shift bits, and is fully described in U.S. Pat. No. 4,330,852, issued to Redwine et al. and assigned to Texas Instruments Inc. Therefore, the column decoder is not required to load the shift register 45. The decoder is utilized for the random mode wherein a specific memory element defined by a row address and a column address is to be read from or written to. The redundant circuitry of the present invention facilitates both the use of a serial shift register having access to all of the column outputs and a random access decoder to provide random access to the memory array 38. In the random mode, the column decoder activates one of the columns and outputs this column to an input/output circuit (not shown). It simulatenously disconnects the output from the respective shift bit.

Referring now to FIG. 2, there is illustrated a schematic block diagram of the array 38 with column "5" determined as defective and the array 38 reconfigured with the redundant column "R", wherein like numerals refer to like parts in the various Figures. To deactivate column "5", the deactivation circuit 36 associated therewith is controlled to deactivate the column decode address input to this column. In addition, the bypass switch 44 associated with the shift bit labeled "5" in the serial shift register 42 is closed to bypass this shift bit. The switch 45 associated with the redundant register "R" in the serial shift register 42 is opened to place the shift bit "R" in series with the remaining shift bits therein. The reconfiguration logic circuit 34 is controlled to change the state of select ones of the SPDT switches in the switch bank 32 to reconfigure the column decode address inputs of select ones of the columns. In the preferred embodiment, the column decode address inputs for columns physically disposed between the defective column "5" and column "R" are incremented by one. Although not illustrated the output on the bit lines of the defective column may also be deactivated such that they do not load down the adjacent shift bits.

For the particular example illustrated in FIG. 2, the switches associated with the decode address inputs of the columns "0" through "4" are activated such that the redundant decode outputs R0–R5 are selected. For column "0", decode output N0 is changed to decode output R1, for column "1", the decode output is changed from N1 to R2, for column "2", the decode output is changed from N2 to R3, for column "3", the decode output is changed from N3 to R4, and for column "4" the decode output is changed from N4 to R5. Therefore, column decode address C4 is "pushed" to column decode address C5. This corresponds to the change in the decode output from N4 to R5. In a similar manner, column "3" has the column decode address pushed from C3 to C4, column "2" has the column decode address pushed from C2 to C3, column "1" has the column decode address pushed from C1 to C2 and column "0" has the column decode address pushed from C0 to C1. In addition, the first switch in the switch bank 32 causes the decode input of the redundant column "R" to be pushed to the C0 column decode address. Therefore, all of the columns that are positioned between the defective column "5" and the redundant column "R" have the column address therefor incremented by a value of one. By controlling the switches 44 and 45, as described above, the physical sequence of the shift register 42 is also maintained. The switches associated with column "6" through column "255" are maintained in their normal position such that the column decode address associated therewith is not incremented.

Referring now to FIG. 3, there is illustrated a schematic block diagram of predecoders 12–20 and the one-of-sixty-four decoder 28, wherein like numerals refer to like parts in the various Figures. All of the predecoders 12, 16, 18 and 20 are identical and only the circuitry associated with the predecoder 16 will be described in detail. The predecoder 16 is comprised of four AND gates 46, 48, 50 and 52. The AND gates 46 and 48 both have one input thereof connected to the inverted address bit $\overline{A3}$ and both AND gates 50 and 52 have one input thereof connected to the noninverted address bit A3. The other input of the AND gate 46 and the other input of the AND gate 50 are connected to the inverted address bit $\overline{A2}$. The other input of the AND gate 48 and the other input of the AND gate 52 are connected to the noninverted address bit A2. The outputs of the AND gates 46–52 comprise the four predecode lines 22.

The one-of-sixty-four decoder 28 is comprised of sixty-four three input NAND gates 54, each having an output associated with one of the outputs $B_0$–$B_{63}$. The three input NAND gate, 54 associated with the $B_0$ output has one input thereof associated with the first of the lines 26 from the predecoder 20, one input thereof associated with the first of the lines 24 from the predecoder 18 and the remaining input thereof associated with the first of the lines 22 from the predecoder 16. The three input NAND gate 54 associated with the output $B_1$ in the one-of-sixty-four decoder 28 has one input thereof associated with the first of the lines 26, the second input thereof associated with the first of the lines 24 and the third input thereof associated with the second of the lines 22, such that a different configuration is selected. The remaining three inputs of NAND gates 54 are connected as shown in U.S. Pat. No. 4,314,362.

Figure 4:
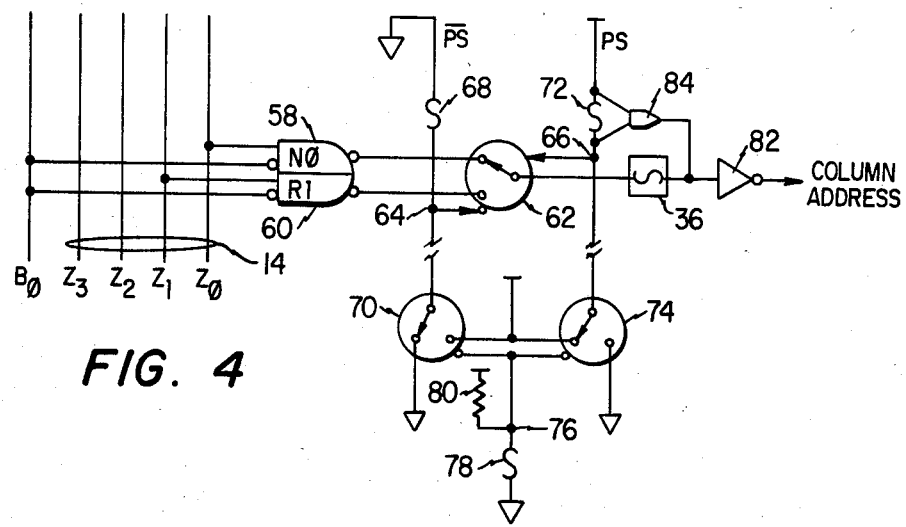
FIG. 4 illustrates a schematic block diagram of one element of the decode circuitry and the reconfiguration logic therefor.

Referring now to FIG. 4, there is illustrated a schematic block diagram of one element of the one-of-four multiplexers 30 showing both the normal selection circuitry and the redundant selection circuitry and the associated SPDT switch of the switch bank 32. The specific normal output illustrated is N0 and the specific redundant output illustrated is R1. The N0 output is decoded with a NAND gate 58 that has one input connected to the $Z_0$ line of the four predecode bus 14 and the other input, an inverting input, which is connected to the $B_O$ output from the one-of-sixty-four decoder 28. The R1 output is decoded with a NAND gate 60 which has one input thereof connected to the $Z_1$ line of the predecode bus 14 and the other input, an inverting input, which is connected to the $B_0$ line. The $N_0$ line is decoded when a signal is present on the $B_O$ line and the $Z_0$ line whereas the R1 output is decoded when the $Z_1$ line and $B_0$ line is active.

The output of the NAND gate 58 is connected to one input of an SPDT switch 62 and the output of the NAND gate 60 is connected to the other input of the SPDT switch 62. The output of the SPDT switch 62 is connected to the input of the deactivation circuit 36, which is comprised of a series fuse. The SPDT switch 62 has two control inputs, one input of which is connected to a node 64 and the other control input of which is connected to a node 66. The node 64, in the normal operating mode, is connected to a signal $\overline{PS}$ through a fuse 68 and also to one input of an SPDT switch 70. The node 66 is connected to a signal PS through a fuse 72 and also to one input of an SPDT switch 74. The $\overline{PS}$ signal is, in the preferred embodiment, $V_{DD}$ and the PS signal is $V_{SS}$.

In normal operating conditions, SPDT switch 70 is configured to connect the node 64 to $V_{SS}$ and the SPDT switch 74 is configured to be connected to $V_{DD}$. When reconfigured, the SPDT switch 70 is switched to $V_{DD}$ and the SPDT switch 74 is switched to $V_{SS}$. The switching operation of the SPDT switches 70 and 74 is controlled through control inputs which are connected to a node 76. Node 76 is pulled to $V_{SS}$ through a fuse 78, the current being supplied from $V_{DD}$ through a resistor 80. When the fuse 78 is opened, the resistor 80 pulls the control inputs of the SPDT switches 70 and 74 to $V_{DD}$. The SPDT switches 70 and 74 and the control circuitry therefor comprise the reconfiguration logic circuit 34.

In operation, the SPDT switch 62 selects the output N0 or the output R1 as a function of the voltage levels on the nodes 64 and 66. In the normal operating condition, the node 66 is connected to $V_{DD}$ and the node 64 is connected to $V_{SS}$. To cause the SPDT switch 64 to change states, the polarities on the switch must be reversed. Therefore, the fuses 68 and 72 are first opened and then the fuse 78 is opened to remove the node 64 from connection with the signal $\overline{PS}$ and remove the node 66 from connection with the signal PS. Opening of the fuse 78 causes the node 68 to be placed at $V_{DD}$ and the node 66 to be placed at $V_{SS}$. This causes the switch 62 to select the R1 decode output from the NAND gate 60. This output is then input to a driver 82 through deactivation circuit 36 to provide the decode address output to the associated column.

As described above, the defective column is removed from the circuit with the deactivation circuit 36. This is effected by opening the internal series fuse therein. Each of the SPDT switches in the switch bank 32, of which one is the SPDT switch 62, has a pair of fuses associated therewith that are similar to the fuses 68 and 72. When the fuses associated with the defective column are opened, all SPDT switches having a lower relative position than the defective column are switched to select the redundant decode output from the one-of-four multiplexers 30 and all columns having a higher relative position than the defective column are maintained in their normal position. In addition, the internal fuse in deactivation circuit 36 is opened on the defective column. This will disconnect the input of the driver 82 and allow it to float.

To prevent the input of the driver 82 from floating, a fuse sense logic circuit 84 is provided which has two inputs, one input of which is connected to one side of the fuse 72 and the other input of which is connected to the other side of the fuse 72 and an output connected to the input of the driver 82. When the fuse 72 is open, the fuse sense logic circuit 84 drives the column address to a deactivated state such that memory elements associated with the defective column will not provide an output.

Figure 5:
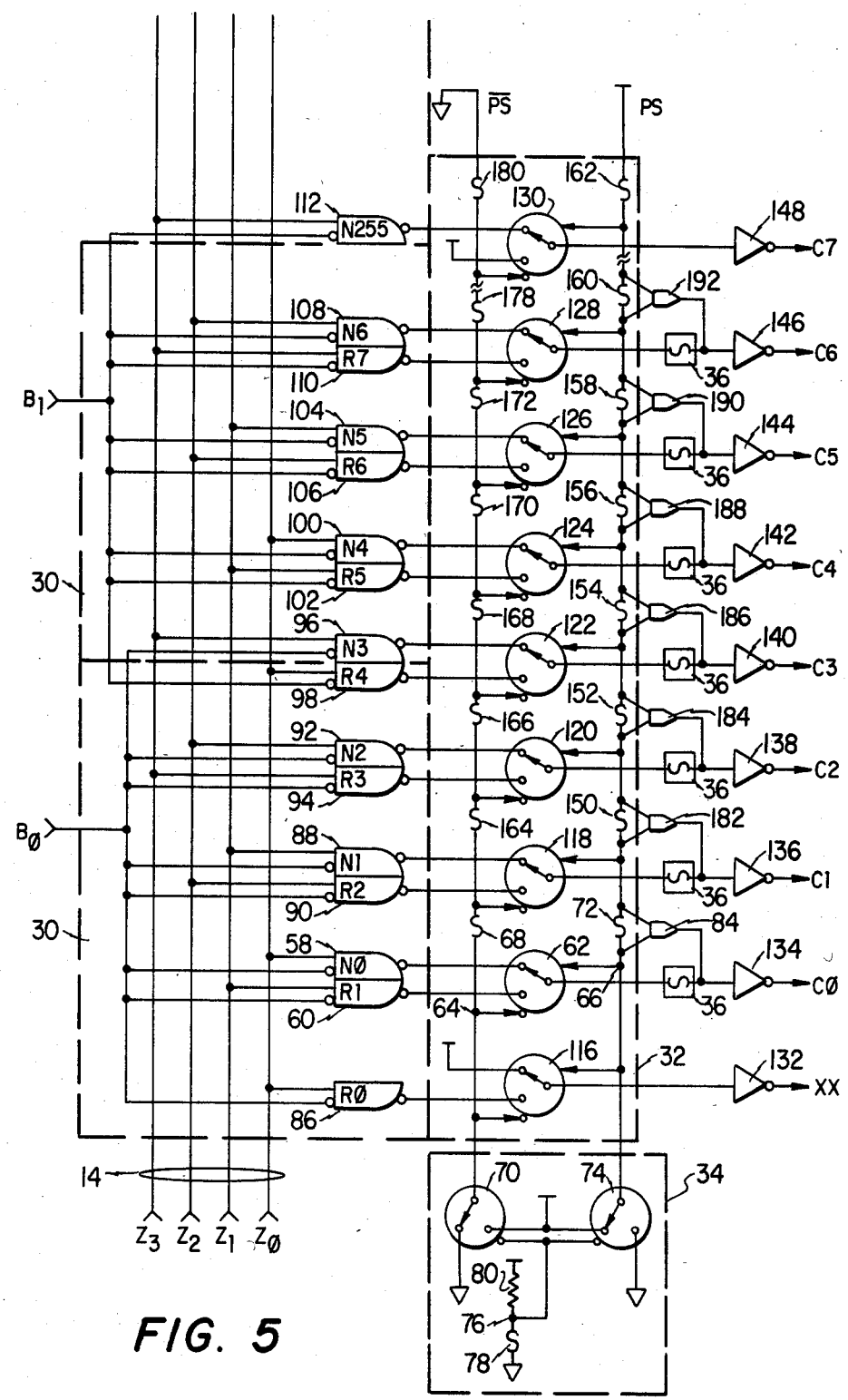
FIG. 5 illustrates a schematic block diagram of the decode circuitry for a bank of output decoders.

Referring now to FIG. 5, there is illustrated a bank of eight of the one-of-four multiplexers 30 connected to the $B_O$ and $B_1$ lines. Each of the decode outputs from the one-of-four multiplexers 30 is associated with a two input NAND gate with inverting and noninverting inputs therefor. The NAND gates are similar to the NAND gates 58 and 60 illustrated in FIG. 4. For simplicity purposes, associated normal and redundant decode output signals are output from separate outputs of the dual NAND gate, of which 58 and 60 are examples. However, the R0 output which controls the redundant column "R" is output from one-half of a dual NAND gate 86. The inputs of the NAND gate 86 are connected similarly to that of the NAND gate 58.

The N1 decode output is output from a NAND gate 88 and the R2 decode output is output from a NAND gate 90. The N2 and R3 decode outputs are output from NAND gates 92 and 94, respectively. The N3 and R4 decode outputs are output from NAND gates 96 and 98, respectively. The N4 and R5 decode outputs are output from NAND gates 100 and 102, respectively. The N5 and R6 decode outputs are output from NAND gates 104 and 106, respectively. The decode outputs N6 and R7 are output from NAND gates 108 and 110, respectively. The N255 decode output is output from a NAND gate 112.

The inputs of the NAND gates 58 and 60 and 86–112 are associated with one of the predecode bus lines 14 and one of the outputs of the one-of-sixty-four multiplexer 28. The NAND gates 58 and 60 and 86–96 are selected by activation of the $B_0$ line and one of the predecode bus lines 14. This selects any of the decode outputs R0–R3 and N0–N3. In a similar manner, the decode outputs from the NANG gates 98–112 are selected by activation of the $B_1$ output of the one-of-sixty-four multiplexer 28 and one of the four predecode bus lines 14. For example, with $B_0$ selected, $Z_0$ gates both NAND gates 86 and 58, $Z_1$ gates both NAND gates 60 and 88, $Z_2$ gates both NAND gates 90 and 92 and $Z_3$ gates both NAND gates 94 and 96. It should be noted that NAND gate 98, for outputting the decode output R4, is associated with the one-of-four multiplexer 30 gated by the $B_1$ signal.

The NAND gate 86 associated with the R0 decode output is input to one input of a SPDT switch 116 which has the other input thereof connected to $V_{DD}$. In a normal position, the output of the SPDT switch 116 is switched to the $V_{DD}$ input and has two control inputs, one of which is connected to the node 66 and one of which is connected to the node 64. The remaining NAND gates 88–114 illustrated in FIG. 5 are associated with SPDT switches configured similar to the SPDT switch 62, as associated with NAND gates 58 and 60. The NAND gates 88 and 90 are associated with a switch 118, the NAND gates 92 and 94 are associated with a switch 120, the NAND gates 96 and 98 are associated with a switch 122, the NAND gates 100 and 102 are associated with a switch 124, the NAND gates 104 and 106 are associated with a switch 126, the NAND gates 108 and 110 are associated with a switch 128. The NAND gate 112 is associated with one input of a switch 130, the other input of which is connected to $V_{DD}$. The output of the switch 116 associated with the R0 decode output is input directly to a driver 132, since the switch in the normal position is connected to $V_{DD}$. The remaining switches 62 and 118–130 are connected through the associated deactivation circuits to drivers 134–148, respectively.

The switches 118–130 have two control inputs, a PS control input and a $\overline{PS}$ control input, similar to the control inputs of the switch 62, and they are arranged in a cascaded arrangement through associated fuses. The switch 62 has the PS control input connected through the fuse 72 to the PS control input of the switch 118. In a similar manner, the switch 118 has the PS control input thereof connected to the PS control input of the switch 120 through a fuse 150. The switches 120–130 are cascaded in a similar manner through fuses 152, 154, 156, 158, 160 and 162, respectively. The fuses associated with the highest position column are connected directly to the PS signal. The $\overline{PS}$ control input of the switch 62 is cascaded to the $\overline{PS}$ signal in a similar manner as the PS control input; that is, the $\overline{PS}$ control input of the switch 62 is connected to the $\overline{PS}$ control input of the switch 118 through the fuse 68 and the $\overline{PS}$ input of the switch 118 is connected through a fuse 164 to the $\overline{PS}$ control input of the switch 120. The $\overline{PS}$ control inputs of the switches 120–130 are connected in a cascade configuration to each other and to the PS signal through fuses 166, 168, 170, 172, 178 and 180, respectively. In addition, each of the fuses 150–162 for connecting the PS control inputs of the switches 118–130 to the PS signal have fuse sense logic circuit, 182–192 associated therewith similar to the fuse sense logic circuit 84. The PS control input of the switch 130 does not need a fuse sense logic circuit since only the NAND gate 112 is associated therewith in the normal positions and the other input of the switch is connected to $V_{DD}$.

Figure 6:
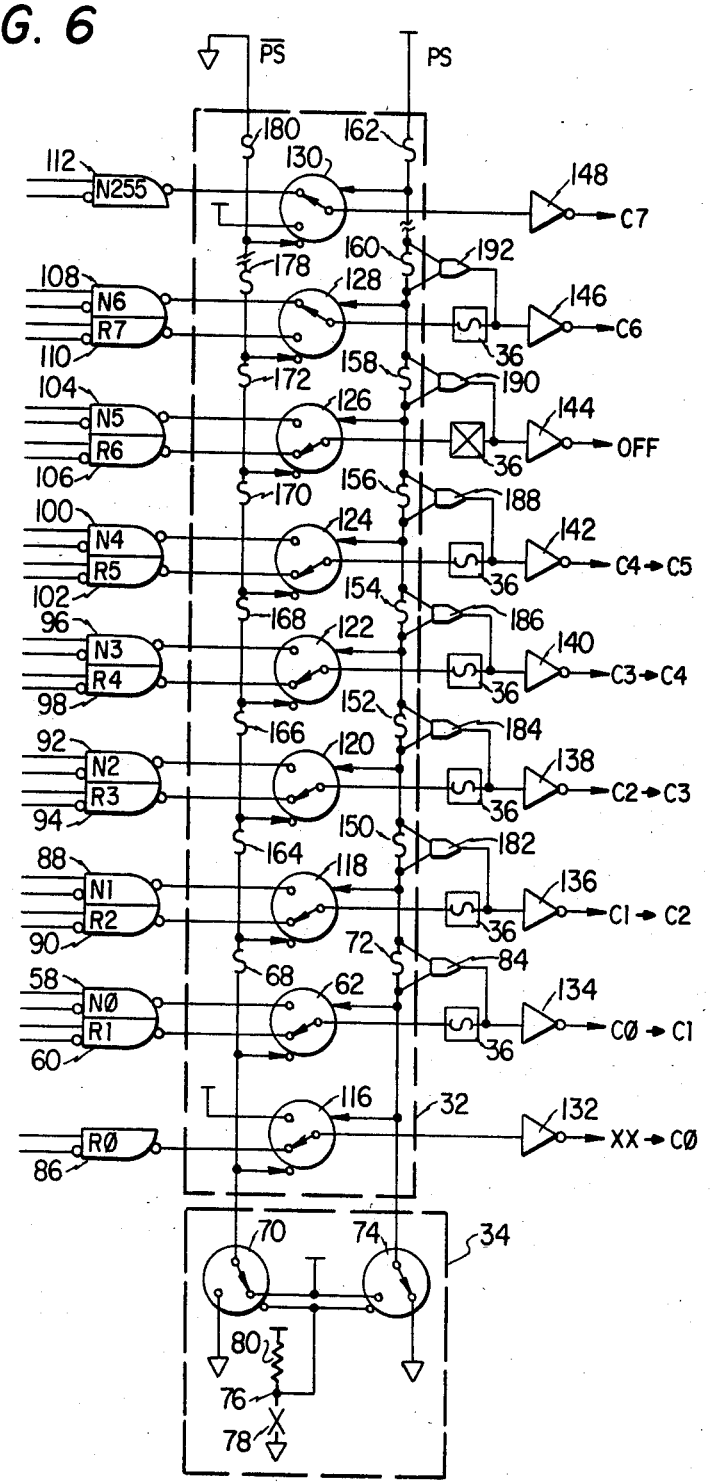
FIG. 6 illustrates a schematic block diagram of the decode circuitry for a bank of decoders with one of the decode outputs deactivated and the redundant decode activated.

Referring now to FIG. 6, there is illustrated a partial schematic block diagram of the decode circuit of FIG. 5 with column "5" determined to be defective, wherein like numerals refer to like parts in the two FIGS. In the normal condition, column "5" is addressed by the column decode address C5. When "5" is defective, the system of the present invention is operable to "push" the column decode addresses such that column "4" is now addressed by column decode address C5, column "3" is addressed by column decode address C4, column "2" is addressed by column decode address C3, column "1" is addressed by column decode address C2, and column "0" is addressed by column decode address C1. The redunant column "R" is now addressed by column decode address C0. Columns "C6" and higher position columns are addressed by the normal column decode addresses.

To change the column decode addresses for the columns below column "5", the fuse 158 associated with the PS control line of the switch 126 and the fuse 172 associated with the $\overline{PS}$ control input of the switch 126 are opened. This effectively removes the PS signal, which is $V_{DD}$, from connection with the control inputs of the switches associated with column positions at and below the column "5" position and also disconnects the $\overline{PS}$ control inputs thereof from connection to the $\overline{PS}$ signal, which is $V_{SS}$. The fuse 78 in the reconfiguration circuit 34 is also opened which causes switch 70 to switch to the $V_{DD}$ terminal and switch 74 to switch to the $V_{SS}$ terminal. This effectively connects the $\overline{PS}$ control inputs of the switches 62 and 116–126 to $V_{DD}$ and the PS control inputs thereof to $V_{SS}$, thereby reversing polarity and changing states of those switches. This causes the switches to select the redundant decode outputs corresponding to the next higher column decode address. For example, in the normal position, the N4 decode output would be selected which corresponds to the C4 column decode address. In the reconfigured mode, the R5 decode output is selected to push the C4 column decode address to the C5 column decode address. The switch 116 is switched from $V_{DD}$ to the R0 decode output to activate the redundant column with the C0 column decode address.

In addition to changing the column decode addresses for all columns between the redundant column "R" and the defective column "5" to a higher address, the deactivation circuit 36 associated with the switch 126 has the internal fuse therein opened to prevent the R6 decode output of the NAND gate 106 from being input to the driver 144. In addition, the fuse sense logic circuit 190 maintains the driver 144 inactive such that no memory elements in column "5" can output signals therefrom.

Figure 7:
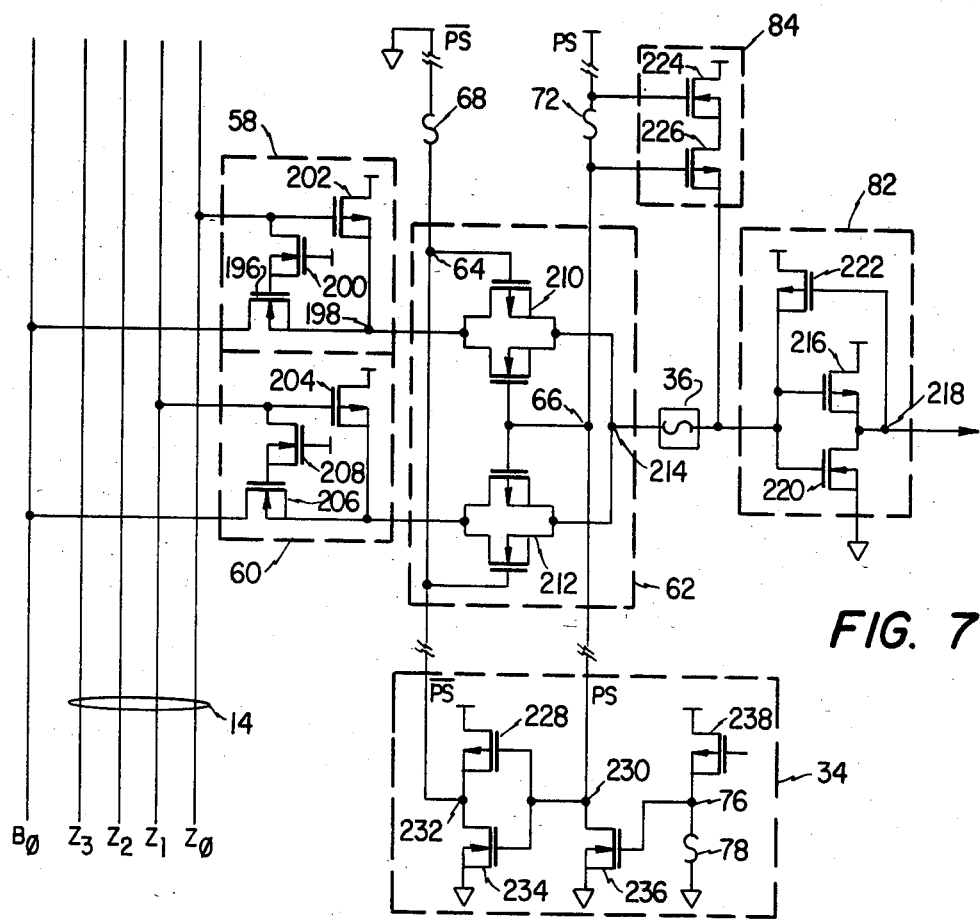
FIG. 7 illustrates a schematic diagram of the reconfiguration logic for one decoder element.

Referring now to FIG. 7, there is illustrated a schematic block diagram of the circuit illustrated in FIG. 4, wherein like numerals refer to like parts of the various Figures. The NAND gate 58 is comprised of a series field effect transistor (FET) 196, which has the drain thereof connected to the $B_0$ line, and the source thereof connected to a node 198, which functions as the output of the NAND gate 58. The gate of the transistor 196 is connected to a transistor 200, the drain of which is connected to the lines $Z_0$, and the gate of which is connected to $V_{DD}$. A P-channel FET 202 has the gate thereof connected to the line $Z_0$, the source thereof connected to the node 198 and the drain thereof connected to $V_{DD}$. When a low logic level is present on the line $Z_0$, the transistor 202 will be thus raising the node 198 to a high logic level. When the $B_0$ line, which is input to the noninverting input of the NAND gate 58, is at a high logic level and the line $Z_0$ is at a high logic level, the transistor 200 pulls the gate of the transistor 196 high, thus causing the logic level of the node 198 to be high. For the node 198 to have a low logic level, the line $Z_0$ must be at a high logic level and the line $B_0$ must be at a low logic level. The NAND gate 60 is comprised of a P-channel transistor similar to the transistor 202, and N-channel transistors 206 and 208, similar to the transistors 196 and 200, respectively. The transistors 204, 206 and 208 operate similar to the transistors 196, 200 and 202 of the NAND gate 58.

The SPDT switch 62 is comprised of two N-channel/P-channel parellel transistor pairs 210 and 212. The drains of the transistor pair 210 are connected to the output of the NAND gate 58 and the drains of the transistor pair 212 are connected to the output of the NAND gate 60. The sources of the transistor pairs 210 and 212 are all connected to a node 214, which is the output of the SPDT switch 62. The gates of the N-channel transistor in the pair 210 and the P-channel transistor in the pair 212 are connected to the node 66. The gates of the P-channel transistor in the pair 210 and the N-channel transistor in the pair 212 are connected to the node 64. Therefore, a high logic level on the node 66 and a low logic level on the node 64 will cause the pair 210 to turn on and the pair 212 to turn off. The reversal of this polarity will cause the opposite situation.

The inverter 82 is comprised of a P-channel transistor 216 having the drain thereof connected to $V_{DD}$ and the source thereof connected to a node 218, which is the column decode signal output. An N-channel transistor 220 has the drain thereof connected to the node 218 and the source thereof connected to $V_{SS}$. The gates of the transistors 216 and 220 are connected together and to the output of the deactivation circuit 36. The transistor 216 conducts when the gate thereof is at a low logic level to force the node 218 to a high logic level and the transistor 220 conducts when the gate thereof is at a high logic level, forcing the node 218 to a low logic level. The transistor 222 turns on when the node 218 is at a low logic level to supply current to the gates of the transistors 220 and 222 during transition from a low to a high logic level.

The fuse sense logic circuit 84 is comprised of an N-channel transistor 224 having the drain thereof connected to $V_{DD}$, the gate thereof connected to the high side of the fuse 72 and the source thereof connected to the drain of a P-channel transistor 226. The P-channel transistor 226 has the gate thereof connected to the low side of the fuse 72 and the source thereof connected to the input of the inverter 82. In operation, the gates of the transistors 224 and 226 are at a common potential when the fuse 72 is intact and are thus at the level of PS or $V_{DD}$, thus causing transistor 226 to be nonconducting. When the fuse 72 is opened, the gate of transistor 224 is at $V_{DD}$ and the gate of transistor 226 is at $V_{SS}$, thus causing transistors 224 and 226 to conduct and pull the input of the inverter 82 high and maintaining it in a deactivated condition.

The reconfiguration circuit 34, as described above, is comprised of two SPDT switches 70 and 74. The switch 70 is comprised of a P-channel transistor 228 having the drain thereof connected to $V_{DD}$, the gate thereof connected to a node 230 and the source thereof connected to a node 232. An N-channel transistor has the drain thereof connected to the node 232, the gate thereof connected to the node 230 and the source thereof connected to $V_{SS}$. The node 232 comprises the $\overline{PS}$ signal which is connected to the PS control inputs o the SPDT switches that have the states thereof changed. The node 230 comprises the PS control line that is connected to the PS control inputs of the SPDT switches that are reconfigured. The node 230 is also connected to the drain of an N-channel transistor 236, the gate of which is connected to the node 76 and the source of which is connected to $V_{SS}$. The resistor 80, which forms a portion of the control circuitry for the switches 70 and 74, is comprised of a P-channel transistor 238 having the drain thereof connected to $V_{DD}$, the gate thereof connected to $V_{SS}$ and the source thereof connected to the node 76. When the fuse 78 is intact, the node 76 is at a low logic level, thus keeping the transistor 236 in the nonconducting state. Since none of the fuses associated with the PS control input of the SPDT switches in the bank 32 is opened in this mode, node 230 is at a high logic level, thus turning on transistor 234 and maintaining node 232 at a low logic level. In the reconfigured mode, the appropriate one of the fuses in the switch bank 32 is opened and the fuse 78 is opened. This causes node 76 to go to a high logic level, thus causing transistor 236 to conduct and pull node 230 to $V_{SS}$. This causes transistor 228 to conduct, thus pulling node 232 to $V_{DD}$.

Figure 8:
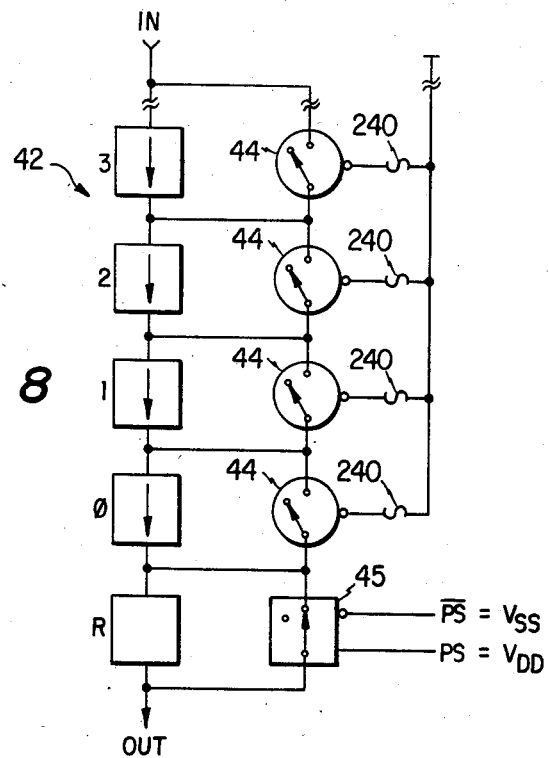
FIG. 8 illustrates a schematic block diagram of the serial shift register with associated switches.

Referring now to FIG. 8, there is illustrated a schematic block diagram of the shift register 42 illustrating the redundant shift register and the shift bits "0" through "3". Each of the switches 44 associated with the shift bits "0" through "3", as described above, is a normally open switch. These switches are controlled by individual fuses 240 which are connected from the control input of the switches 44 to $V_{DD}$. As long as $V_{DD}$ is connected to the control input, the switches 44 are maintained in a normally open position. The normally closed switch 45 is controlled by the state of the PS and $\overline{PS}$ signals output from the reconfiguration circuit 34, such that the switch is in the normally closed position when PS is equal to $V_{SS}$ and $\overline{PS}$ is equal to $V_{DD}$, as is the case in the normal operating mode. When switch 45 is closed, the signal is passed around the "R" shift bit. When one of the shift bits is to be bypassed, the associated fuse 240 is opened, thus causing the switch 44 associated therewith to change state to a closed position. This routes the signal around the associated shift bit, thus deleting it from the shift register sequence. Reconfiguration of the switch bank 32 by the reconfiguration control circuit 34 and opening of the associated fuses causes the switch 45 to open, thus placing the shift bit "R" in series with the remaining shift bits on the output thereof.

Figure 9:
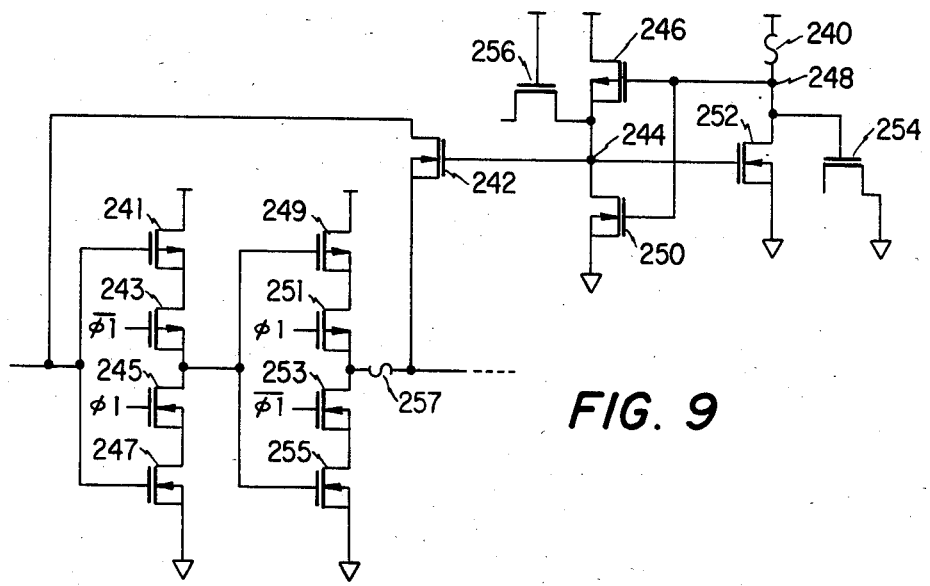
FIG. 9 illustrates a schematic block diagram of the circuitry bypassing a shift bit.

Referring now to FIG. 9, there is illustrated a schematic block diagram of the switches 44 for deleting one of the registers out of the serial shift register 42. A transistor 242 has the drain and source thereof bridging the input and output of an associated one of the shift bits in the serial shift register 42. The gate of the transistor 242 is connected to a node 244. A P-channel transistor 246 has the drain thereof connected to $V_{DD}$, the source thereof connected to the node 244 and the gate thereof connected to a node 248. The fuse 240 is connected between $V_{DD}$ and the node 248. An N-channel transistor 250 has the drain thereof connected to the node 244, the source thereof connected to $V_{SS}$ and the gate thereof connected to the node 248. An N-channel transistor 252 has the drain thereof connected to the node 248, the source thereof connected to $V_{SS}$ and the drain thereof connected to node 244. A capacitor 254 is connected between node 248 and $V_{SS}$ and a capacitor 256 is connected between node 248 and $V_{DD}$.

In operation, the fuse 240, when intact, raises node 248 to $V_{DD}$, thus causing transistor 250 to conduct and pull node 244 to $V_{SS}$ to maintain transistor 240 nonconducting. When node 244 is pulled to $V_{SS}$, transistor 252 is nonconducting also. When fuse 240 is opened, node 248 begins to make a transition to a low logic level, thus reducing the conductance of transistor 250. This causes transistor 252 to turn on and pull node 248 to $V_{SS}$, thus turning on transistor 246 and pulling node 244 to $V_{DD}$. This turns on transistor 242 and bypasses the associated register in the serial shift register 42.

Each shift bit in shift register 42 is comprised of two cascaded stages with each stage being comprised of four series transistors. The first stage is comprised of two N-channel transistors 241 and 243 and two P-channel transistors 245 and 247. The transistor 241 has the source thereof connected to $V_{SS}$ and the drain thereof connected to the source of transistor 243. The drain of transistor 243 is connected to the source of 245 and the drain of transistor 245 is connected to the source of transistor 247. Transistor 247 has the drain thereof connected to $V_{DD}$. The gates of transistors 241 and 247 are connected together and comprise the input of the shift bit. The gate of transistor 243 is connected to a clock signal $\phi 1$ and the gate of transistor 245 is connected to the inverted form thereof.

The second stage is comprised of two N-channel transistors 249 and 251 and two P-channel transistors 253 and 255. The transistors 249, 251, 253 and 255 are connected similar to the transistors 241, 243, 245 and 247, with the gates of transistors 249-255 connected together to form the input of the second stage. This input is connected to the source of the transistor 245 with the output of the shift bit connected to the source of the transistor 253. The gate of transistor 251 is driven by a clock signal $\overline{\phi 1}$ with the gate of transistor 253 being driven by the inverted form thereof. The transistor 242 has the drain thereof connected to the input of the shift bit and the source thereof connected to the output of the shift bit through a series fuse 257. The fuse 257, when opened presents loading of subsequent stages. In operation, data is clocked from the input of the shift bit to the output of the first stage when $\phi 1$ goes to a high logic level. This stores the data in the bit. When $\overline{\phi 1}$ goes high, the data stored in the shift bit is output therefrom.

Figure 10:
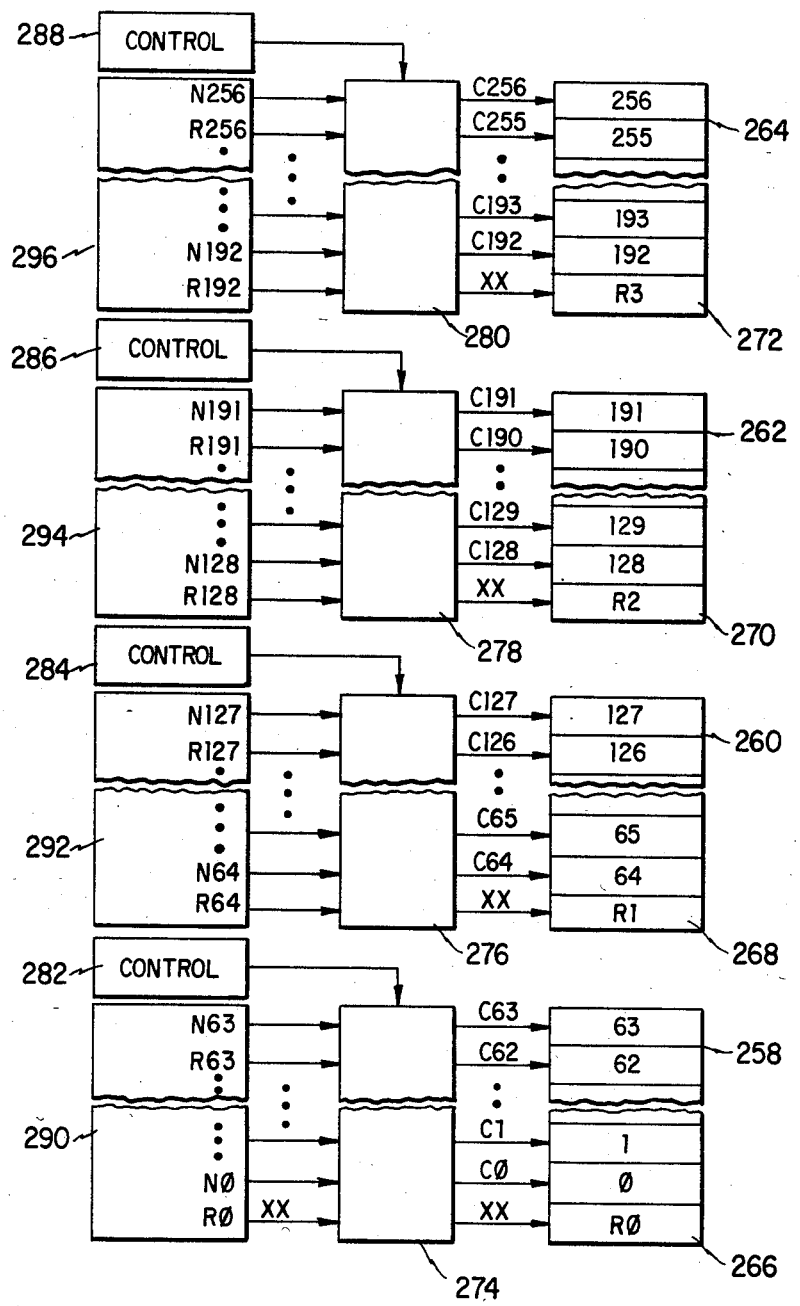
FIG. 10 illustrates a schematic block diagram of a alternate embodiment utilizing banks of memory with a redundant column associated with each bank.

Referring now to FIG. 10, there is illustrated a schematic block diagram of an alternate embodiment with the memory array divided into banks with an associated redundant column for each bank. The 256 columns in the memory array 38 are divided up into four banks 258, 260, 262 and 264. The array bank 258 contains columns "0" through "63". The array bank 260 contains columns "64" through "127". The column 262 contains column "123" through "191". The array bank 264 contains columns "192" through "256".

The array bank 258 has a redundant column 266 labeled "R0" disposed adjacent column "0". The array bank 260 has a redundant column 268 labeled "R1" and disposed adjacent column "64". The array bank 262 has a redundant column labeled "R2" disposed adjacent column "128". The array bank 264 has a redundant column 272 labeled "R3" disposed adjacent column "192". Each of the redundant columns 266-272 can be activated to replace a defective column in the associated array bank. By segmenting the array into a number of discrete banks, the semiconductor memory is afforded a higher degree of fault tolerance.

The array banks 258-264 have switch banks 274, 276, 278 and 280, respectively associated therewith which are similar to the switch bank 32 of FIG. 1. The switch banks 274-280 are controlled by reconfiguration control circuits 282, 284, 286 and 288, respectively, similar to the reconfiguration control circuit 34. The inputs of the switch banks 274-280 are driven by column decode circuits 290, 292, 294 and 296, respectively. The decode circuit 290 provides redundant decode outputs R0 through R63 and normal outputs N0-N63. The decode circuit 292 provides redundant outputs R64 through R127 and normal outputs N64 through N127. The decode circuit 294 provides redundant decode outputs R128 through R191 and normal decode outputs N128 through N191. The decode circuit 296 provides redundant decode outputs R192 through R256 and normal decode outputs N192 through N256. The decoders 290-296 are similar to the one-of-four multiplexers 30 except that the highest order switch in the switch banks 274-280 does not switch to a redundant output when the highest position column in the associated array is defected. For example, if column "63" in array bank 258 were defective, the switch associated therewith would merely be open and the address of column "62" incremented by one. It would not be necessary to provide a switch for incrementing the address of column "63" since the next higher position column, column "64", is associated with a separate redundant column 268.

In summary, there has been provided circuitry for replacing a defective column and shift register bit in a video Random Access Memory. The decode logic circuitry is comprised of normal decode outputs and redundant decode outputs and a switch bank for selectively switching therebetween, wherein the redundant decode output is associated with a higher address than the normal decode output. This allows each physical column to have access to two adjacent column addresses. The switches associated with the decode outputs are cascaded such that two fuses can be opened to change the state of all the switches below the fuses and maintain the normal state in all of the switches above the fuses. Therefore, all columns below a defective column can be controlled to have their address incremented by one and, in addition, a redundant column is activated and has its address set equal to the address of the first column. The shift bit associated with the defective column is bypassed and an additional bit inserted in series with the output, this additional bit loaded from the redundant column. In this manner, one column placed in parallel with a memory array can be activated to replace a defective column and its associated shift register bit by changing the addresses of all of the columns between the redundant column and the defective column.

Although the preferred embodiment has been described in detail, it should be understood that various changes, substitutions and alterations can be made therein without departing from the spirit and scope of the invention as defined by the appended claims.

What is claimed is:

1. A defect tolerant memory, comprising:
    primary memory means having an array of memory elements arranged in rows and columns, each column of memory elements selected by a column address signal and each row of memory elements selected by a row address signal;
    redundant memory means having a plurality of memory elements arranged in a column for replacing a defective one of the column of memory elements in said primary memory means, said redundant memory means having a predetermined physical relationship relative to the columns in said primary memory means and selected by a predetermined one of said column address signal, the memory elements therein selected by one of said row address signals;
    said redundant memory means normally inactive;
    deactivating means for deactivating a defective one of the columns in said primary memory means; and
    reconfiguring means for activating said redundant memory means and reconfiguring said associated column addresses of the columns in said primary memory means such that said predetermined column address is associated only with said redundant memory means and the one of said column addresses associated with the defective one of the columns in said primary memory means is associated with another column therein.

2. The defect tolerant memory of claim 1 wherein said primary memory means comprises a semiconductor memory array and said redundant memory means comprises a column of memory elements disposed adjacent said array.

3. The defect tolerant memory of claim 2 wherein said predetermined column address is the address of the lowest order column in said array.

4. The defect tolerant memory of claim 1 wherein said predetermined column address comprises the column address corresponding to the column in said primary memory means adjacent the memory elements in said redundant memory means.

5. The defect tolerant memory of claim 4 and further comprising:
    a serial shift register having:
        a plurality of series connected primary shift bits, each of said primary shift bits associated with one of the columns in said primary memory means and operable to receive the data output therefrom, and
        a redundant shift bit in series with said primary shift bits and corresponding to said redundant memory means, said redundant shift bit operable to receive the data output from said redundant memory means;
    first switch means for selectively bypassing one of said primary shift bits, said first switch means in the normally open position;
    second switch means for selectively bypassing said redundant shift bits, said second switch means in the normally closed position; and
    control means to control said first and second switch means to bypass the one of said primary shift bits associated with the defective column in said primary memory means and remove the bypass from said redundant shift bit, said control means operating in response to said reconfiguring means activating said redundant memory means.

6. The defect tolerant memory of claim 1 wherein said reconfiguring means increments the associated addresses of the columns that are physically disposed between said redundant memory means and the defective one of the columns in said primary memory means.

7. The defect tolerant memory of claim 1 wherein said primary memory means comprises a semiconductor memory and said redundant memory means comprises a column of memory elements disposed adjacent said semiconductor array, said predetermined column address being equal to the associated column address of the column in said semiconductor array adjacent said redundant column, said reconfiguring means incrementing the associated column addresses of the columns in said semiconductor array disposed between said redundant column and the defective one of the columns in said semiconductor array.

8. A defect tolerant memory, comprising:
    an array of memory elements arranged in rows and columns, each column of memory elements selected by a column decode signal and each row of memory elements selected by a row decode signal;
    a redundant column of memory elements disposed adjacent one column in said array and selectable by a redundant column decode signal;
    a row decoder for receiving a row address signal and generating said row decode signals, each of said row decode signals corresponding to a specific one of said row address signals;
    a column decoder for receiving a column address signal and generating said column decode signals, each of said column decode signals corresponding to a specific one of said column address signals;
    said redundant decode signal corresponding to the associated column address of the column in said array adjacent said redundant column, said redundant decode signal normally inactive;
    deactivation means for deactivating a defective one of columns in said array; and
    reconfiguring means for reconfiguring said column decoder to generate said redundant column decode signal and incrementing by one the associated addresses of the columns in said array that are disposed between said redundant column and the defective one of the columns in said array.

9. The defect tolerant memory of claim 8 wherein said column decoder generates intermediate column decode signals and said reconfiguration means comprises a plurality of switches associated with each column in said array and said redundant column, each of said switches having the output thereof connected to the column decode signal input of the columns in said array and the redundant column decode signal input of said redundant column, said switches operable to switch between an intermediate decode signal output of said column decoder and a redundant decode signal output, said redundant decode signal associated with a column address having a value of one greater than the column address associated with said intermediate decode signal, said switch selecting said redundant decode signal when reconfigured.

10. The defect tolerant memory of claim 8 wherein said column decoder outputs a first intermediate column decode output signal for each of the columns in said array associated with the address of the columns in said array in the unreconfigured state and a second intermediate decode output signal associated with each of the columns in said array and having an associated address that is incremented by one relative to the address of the associated one of said first intermediate decode output signals;

said reconfiguring means comprising a bank of switches associated with each of the columns in said array and said redundant column, the output of each of the switches connected to the decode input of the associated one of the columns in said array and the redundant decode input of said redundant column and operable to be switched from connection with the physically associated one of said first intermediate decode signals in the unreconfigured mode and the associated one of said second intermediate decode signals in the reconfigured mode; and control means for switching only the switches physically associated with the columns disposed between said redundant column and the defective one of the columns in said array.

11. The defect tolerant memory of claim 10 wherein each of said switches has a control input with the state of said switch being determined by the polarity on said control input, said control means comprising:

a fuse disposed between the control inputs of each of said switches associated with the columns in said array, the control input of the one of said switches associated with said redundant column connected to the column in said array adjacent said redundant column;

a first polarity connected to said switch associated with the column in said array; and control means for reversing said first polarity on the control inputs of said switches associated with said redundant column and the column of said array adjacent thereto, said control means having a fuse internal thereto, opening of said internal fuse activating said control means;

opening of one of said fuses between control inputs of adjacent ones of said switches and the internal fuse of said control means causing the control input of the ones of said switches between said open fuse and said redundant column to have the polarity determined by said control means, the remaining of said switches having the control inputs thereof at said first polarity.

12. The defect tolerant memory of claim 11 wherein said deactivation means comprises a series fuse between the output of each of said switches and the decode input of the associated column in said array, opening of said series fuse preventing a decode signal from being input thereto.

13. The defect tolerant memory of claim 9 and further comprising:

a serial shift register having a plurality of series connected primary shift bits, each of said primary shift bits associated with the output of each of the columns in said array for receiving data therefrom;

a redundant shift bit associated with said redundant column and disposed adjacent and in series with the one of said primary shift bits associated with the column of said array adjacent said redundant column;

a plurality of normally open switches each associated with one of said primary shift bits for bypassing the associated one of said primary shift bits;

a normally closed switch bypassing said redundant shift bit; and control means for closing a select one of said normally open switches to bypass the one of said primary shift bits associated with the defective column in said array, said control means opening said normally closed switch to remove the bypass from said redundant shift bit.

14. The defect tolerant memory of claim 13 wherein said control means has an internal fuse therefor and is activated in response to opening of said internal fuse.

15. A defect tolerant memory, comprising:

an array of memory elements arranged in rows and columns, each column of memory elements having a predetermined physical position with respect to each other and each selected by a specific column address, each row of memory elements selected by a specific row address;

a plurality of primary shift bits, each of said primary shift bits associated with the output of each of the columns in said array and arranged to form a serial shift register;

a plurality of normally closed switches, each of said switches operable to bypass the associated one of said primary shift bits when closed;

a redundant column of memory elements disposed adjacent the lowest position one of the columns in said array, said lowest position column in said array having the lowest column address therefor;

a redundant shift bit associated with the output of said redundant column and connected in series with said primary shift bits;

a normally closed switch bypassing said redundant shift bits, opening of said normally closed switch allowing said redundant shift bit to become a part of said serial shift register on one end thereof;

deactivation means for deactivating a defective one of the columns in said array;

reconfiguring means for addressing said redundant column memory with the address of the column in said array having the lowest column address therefor and incrementing the addresses associated with each of the columns in said array physically disposed between said redundant column memory and the defective one of the columns in said array; and switch control means for closing the one of said normally open switches associated with the one of said primary shift bits connected to the output of the defective one of the columns in said array and opening said normally closed switch associated with said redundant shift bit.

16. A method for replacing a defective column in a semiconductor memory, comprising:

disposing a plurality of memory elements in an array, the memory elements arranged in rows and columns, each column selected by a specific column address signal and each row selected by a specific row address signal, the columns of memory elements arranged in a predetermined position with ascending column addresses from the lowest position to the highest position;

disposing a redundant column of memory elements adjacent the lowest position column in the array and normally inactive, the redundant column addressable by the address of the lowest position column in the array when activated;

deactivating a column of memory elements in the array when determined to be defective; and activating the redundant column of memory elements when the defective column in the array is deactivated and reconfiguring the addresses of the columns in the memory array physically disposed between the redundant column and the defective column such that the addresses associated therewith are incremented by one.

17. The method of claim 16 and further comprising:

disposing a plurality of primary shift bits adjacent the array, each of the primary shift bits associated with the output of each of the columns in the array to receive the output therefrom;

disposing a redundant shift bit on the output of the redundant column to receive data output therefrom, the primary shift bits arranged as a serial shift register and the redundant shift bit placed in series therewith and normally bypassed; and bypassing the primary shift bit associated with the output of the defective column in the array and removing the bypass from the redundant shift bit when a defective column is deactivated.

* * * * *